(12) United States Patent
Jung et al.

(10) Patent No.: US 9,006,746 B2
(45) Date of Patent: Apr. 14, 2015

(54) SCHOTTKY BARRIER DIODE AND METHOD FOR MANUFACTURING SCHOTTKY BARRIER DIODE

(71) Applicant: Hyundai Motor Company, Seoul (KR)

(72) Inventors: Youngkyun Jung, Seoul (KR); Dae Hwan Chun, Gwangmyung Gyeonggi-Do (KR); Kyoung-Kook Hong, Hwaseong (KR); Jong Seok Lee, Suwon (KR); Junghee Park, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/143,649

(22) Filed: Dec. 30, 2013

(65) Prior Publication Data

US 2015/0076515 A1    Mar. 19, 2015

(30) Foreign Application Priority Data

Sep. 13, 2013   (KR) .................. 10-2013-0110672

(51) Int. Cl.
*H01L 29/161*   (2006.01)
*H01L 29/872*   (2006.01)
*H01L 29/66*    (2006.01)
*H01L 29/16*    (2006.01)

(52) U.S. Cl.
CPC .......... *H01L 29/872* (2013.01); *H01L 29/6606* (2013.01); *H01L 29/1608* (2013.01)

(58) Field of Classification Search
None
See application file for complete search history.

(56) References Cited

U.S. PATENT DOCUMENTS

| 5,719,409 | A * | 2/1998 | Singh et al. ...................... 257/77 |
| 6,184,564 | B1 * | 2/2001 | Gould ............................ 257/486 |
| 6,404,033 | B1 * | 6/2002 | Chang et al. .................... 257/484 |
| 7,187,021 | B2 * | 3/2007 | Mitra et al. .................... 257/264 |
| 2002/0125541 | A1 * | 9/2002 | Korec et al. .................... 257/471 |
| 2004/0110330 | A1 * | 6/2004 | Collard ........................ 438/167 |
| 2006/0226504 | A1 * | 10/2006 | Hatakeyama et al. ........ 257/472 |
| 2014/0167201 | A1 * | 6/2014 | Arai et al. ..................... 257/471 |

* cited by examiner

*Primary Examiner* — Joseph Schoenholtz
(74) *Attorney, Agent, or Firm* — Mintz Levin Cohn Ferris Glovsky and Popeo, P.C.; Peter F. Corless

(57) ABSTRACT

A Schottky barrier diode and a method of manufacturing the diode are provided. The diode includes an n− type epitaxial layer disposed on a first surface of an n+ type silicon carbide substrate and a plurality of p+ regions disposed within the n− type epitaxial layer. An n+ type epitaxial layer is disposed on the n− type epitaxial layer, a Schottky electrode is disposed on the n+ type epitaxial layer, and an ohmic electrode is disposed on a second surface of the n+ type silicon carbide substrate. The n+ type epitaxial layer includes a plurality of pillar parts disposed on the n− type epitaxial layer and a plurality of openings disposed between the pillar parts and that expose the p+ regions. Each of the pillar parts includes substantially straight parts that contact the n− type epitaxial layer and substantially curved parts that extend from the substantially straight parts.

11 Claims, 9 Drawing Sheets

SCHOTTKY BARRIER DIODE AND METHOD FOR MANUFACTURING SCHOTTKY BARRIER DIODE

CROSS-REFERENCE TO RELATED APPLICATION

This application claims priority to and the benefit of Korean Patent Application No. 10-2013-0110672 filed in the Korean Intellectual Property Office on Sep. 13, 2013, the entire contents of which are incorporated herein by reference.

BACKGROUND (a) Field of the Invention

The present invention relates to a Schottky barrier diode that includes silicon carbide (SiC) and a method for manufacturing the Schottky barrier diode.

(b) Description of the Related Art

A Schottky barrier diode (SBD) using a Schottky junction, in which a metal and a semiconductor form a junction, without using a P-N junction, unlike a conventional P-N diode, represents a rapid switching characteristic and has a turn-on voltage characteristic lower than that of the P-N diode.

The conventional Schottky barrier diode uses a junction barrier Schottky (JBS) structure in which a p+ region is formed at a lower end of a Schottky junction portion to reduce a leakage current, to thus obtain an effect of blocking a leakage current and improving a breakdown voltage by overlapping P-N diode depletion layers diffused when applying a reverse voltage. However, since the p+ region is present at the Schottky junction portion, a contact area between a Schottky electrode, which is a forward current path, and an n− epitaxial layer or an n− drift layer, reduces causing a resistance value to increase and on resistance of the Schottky barrier diode increase when applying a forward voltage.

The above information disclosed in this section is merely for enhancement of understanding of the background of the invention and therefore it may contain information that does not form the prior art that is already known in this country to a person of ordinary skill in the art.

SUMMARY

The present invention provides a Schottky barrier diode in which on resistance is reduced when applying a forward voltage increasing a Schottky junction area.

An exemplary embodiment of the present invention provides a Schottky barrier diode that may include: an n− type epitaxial layer disposed on a first surface of an n+ type silicon carbide substrate; a plurality of p+ regions disposed within the n− type epitaxial layer; an n+ type epitaxial layer disposed on the n− type epitaxial layer; a Schottky electrode disposed on the n+ type epitaxial layer, and an ohmic electrode disposed on a second surface of the n+ type silicon carbide substrate, in which the n+ type epitaxial layer may include a plurality of pillar parts disposed on the n− type epitaxial layer and openings disposed between the pillar parts and the openings may expose the p+ regions, and each of the pillar parts may include substantially straight line parts that contact the n− type epitaxial layer and substantially curved line parts that extend from the substantially straight line parts.

The Schottky electrode may include a first Schottky electrode disposed on a pillar part and contacting the substantially curved line part of the pillar part and a second Schottky electrode that protrudes from the first Schottky electrode. The second Schottky electrode may be disposed in an opening of the n+ type epitaxial layer and a lower end of the second Schottky electrode may contact the p+ region. A side of the second Schottky electrode may contact the substantially straight line part of the pillar part.

Another exemplary embodiment of the present invention provides a method of manufacturing a Schottky barrier diode that may include: forming an n− type epitaxial layer on a first surface of an n+ type silicon carbide substrate; forming a plurality of p+ regions by implanting a p+ ion into a surface of the n− type epitaxial layer; forming an oxide layer on the n− type epitaxial layer and the p+ region; forming a first oxide layer pattern, which may expose a portion of the n− type epitaxial layer, by etching the oxide layer; forming a reserved n+ type epitaxial layer between the oxide layer patterns and on the oxide layer patterns; forming a reserved n+ type epitaxial layer pattern between the oxide layer patterns by removing the reserved n+ type epitaxial layer disposed on the oxide layer pattern; forming a n+ type epitaxial layer by removing the oxide layer pattern and then etching an upper portion of the reserved n+ type epitaxial layer pattern; forming a Schottky electrode on the n+ type epitaxial layer; and forming an ohmic electrode on a second surface of the n+ type silicon carbide substrate.

Further, the n+ type epitaxial layer may include a plurality of pillar parts disposed on the n− type epitaxial layer and a plurality of openings disposed between the pillar parts and expose the p+ regions. Each of the pillar parts may include substantially straight line parts which contact the n− type epitaxial layer and substantially curved line parts which extend from the straight line parts. The openings may be formed by removing the oxide layer pattern and the pillar part may be formed by etching the upper portion of the reserved n+ type epitaxial layer pattern. The forming of the Schottky electrode may include forming a Schottky electrode on the pillar part and in the opening. A height of an upper surface of the oxide layer pattern may be about equal to that of an upper surface of the reserved n+ type epitaxial layer pattern.

According to the exemplary embodiments of the present invention, the n+ epitaxial layer may include the pillar part and the opening and the Schottky electrode may be disposed on the pillar part and in the opening to increase the Schottky junction area, to thus reduce the on resistance when applying the forward voltage. Therefore, it may be possible to improve the current density of the Schottky barrier diode.

DETAILED DESCRIPTION

Figure 1:
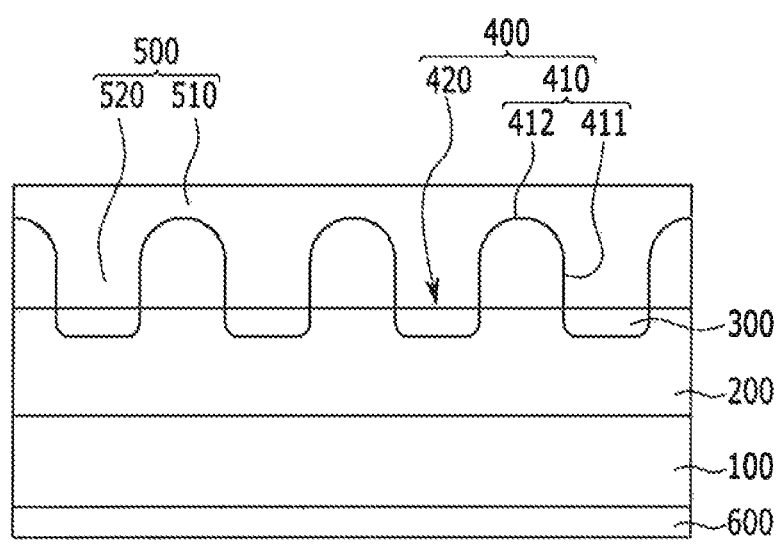
FIG. 1 is an exemplary cross-sectional view of a Schottky barrier diode according to an exemplary embodiment of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present invention will be described in detail with reference to the accompanying drawings. As those skilled in the art would realize, the described exemplary embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, the layer may either be directly on the other layer or substrate, or may be spaced from the other layer (indirectly on the other layer). Like reference numerals designate like elements throughout the specification.

FIG. 1 is an exemplary cross-sectional view of a Schottky barrier diode according to an exemplary embodiment of the present invention. Referring to FIG. 1, in the Schottky barrier diode, an n− type epitaxial layer 200 may be disposed on a first surface of an n+ type silicon carbide substrate 100 and a plurality of p+ regions 300 may be disposed within the n− type epitaxial layer 200. An n+ type epitaxial layer 400 having a concentration greater than that of the n− type epitaxial layer 200 may be disposed on the n− type epitaxial layer 200 and a Schottky electrode 500 may be disposed on the p+ region 300 and the n+ type epitaxial layer 400. An ohmic electrode 600 may be disposed on a second surface of the n+ type silicon carbide substrate 100.

The n+ type epitaxial layer 400 may include a plurality of pillar parts 400 (e.g., protrusions) and a plurality of openings 420 (e.g., recessed portions) which may be disposed between the pillar parts 410 and may expose the p+ regions 300. Each of the pillar parts 410 may include substantially straight line parts 411 (e.g., the side of the protrusion may be substantially straight) which may contact the n− type epitaxial layer 200 and substantially curved line parts 412 (e.g., one end of the protrusion may be a substantially convex shape) which may extend from the substantially straight line parts 411. The substantially curved line part 412 may be a protruding shape. An interval between the pillar parts 410 may be substantially equal to a width of the p+ region 300.

The Schottky electrode 500 may include a first Schottky electrode 510 and a second Schottky electrode 520 which may protrude from the first Schottky electrode 510. The first Schottky electrode 510 may contact the substantially curved line parts 412 of each pillar part 410 of the n+ type epitaxial layer 400. The second Schottky electrodes 520 may be disposed in each of the openings 420 of the n+ type epitaxial layer 400 and lower ends of the second Schottky electrodes 520 may contact the p+ regions 300. Further, since the second Schottky electrode 520 may be disposed in each of the openings 420 of the n+ type epitaxial layer 400, the sides of the second Schottky electrodes 520 may contact the substantially straight line parts 411 of each pillar part 410 of the n+ type epitaxial layer 400.

In other words, the first Schottky electrode 510 may contact the substantially curved line part 412 of each pillar part 410 of the n+ type epitaxial layer 400 and the second Schottky electrode 520 may contact the substantially straight line part 411 of each pillar part 410 of the n+ type epitaxial layer 400, and thus the Schottky junction area may be increased compared to the related art. Therefore, the on resistance may be decreased when applying a forward voltage, thus improving a current density of the Schottky barrier diode. Further, a depletion layer may be formed between the p+ regions 300 when applying a reverse bias, to reduce a leakage current.

Moreover, a method of manufacturing a Schottky barrier diode according to an exemplary embodiment of the present invention will be described in detail with reference to FIGS. 1 and 2 to 9. FIGS. 2 to 9 are exemplary views of a method for manufacturing a Schottky barrier diode according to an exemplary embodiment of the present invention.

Figure 2:
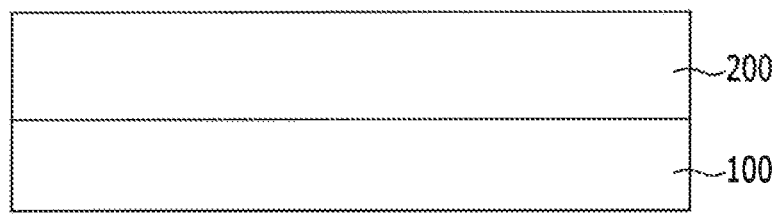
FIGS. 2 to 9 are exemplary views of a method for manufacturing a Schottky barrier diode according to an exemplary embodiment of the present invention.
Figure 3:
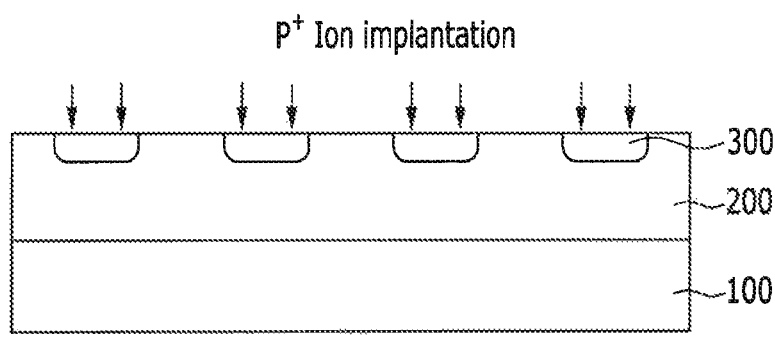
Figure 4:
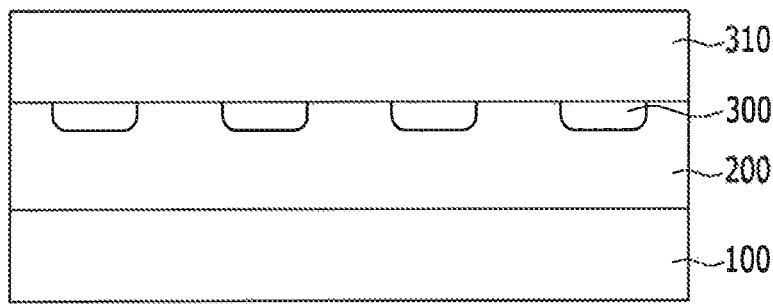

Referring to FIG. 2, the n+ type silicon carbide substrate 100 may be prepared and the n− type epitaxial layer 200 may be formed on the first surface of the n+ type silicon carbide substrate 100 by a first epitaxial growth. Referring to FIG. 3, a p+ ion may be implanted into some parts of the surface of the n− type epitaxial layer 200 to form the plurality of p+ regions 300 (e.g., the p+ ion is not implanted into the entire surface of the n− type epitaxial layer). Referring to FIG. 4, an oxide layer 310 may be formed on the n− type epitaxial layer 200 and the p+ regions 300. In this configuration, the oxide layer 310 may be replaced with other materials which may be easily etched.

Figure 5:
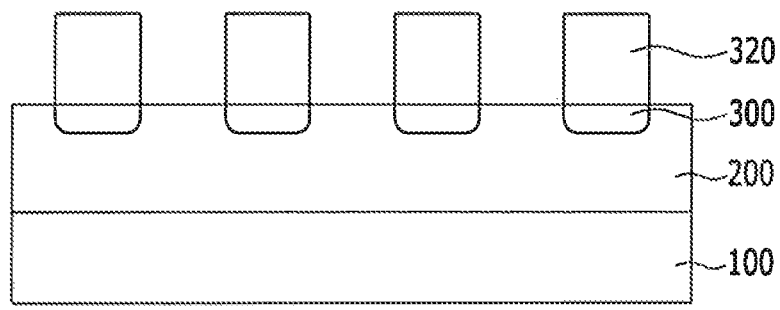
Figure 6:
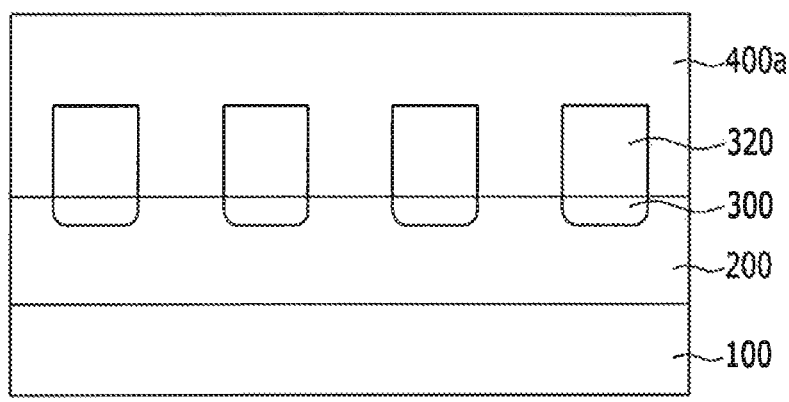
Figure 7:
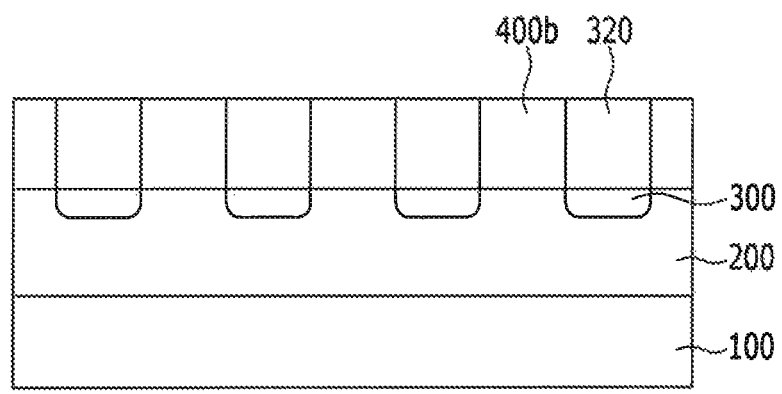
Figure 8:
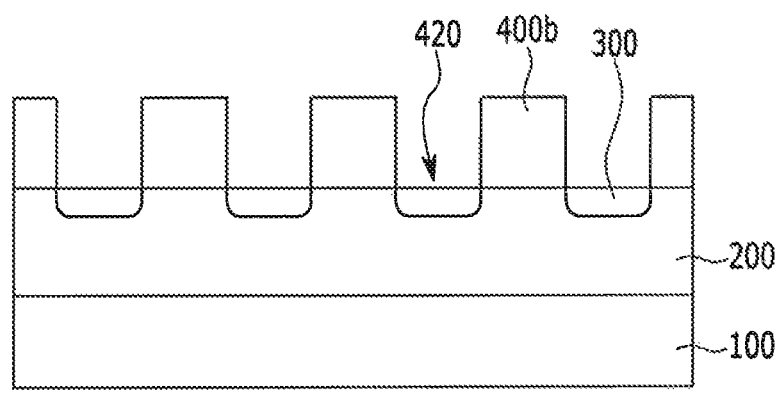

Referring to FIG. 5, oxide layer patterns 320, which may expose a portion of the n− type epitaxial layer 200, may be formed by etching the oxide layer 310. In other words, the oxide layer patterns 320 may be disposed on the p+ regions 300. Referring to FIG. 6, a reserved n+ type epitaxial layer 400a may be formed on the n− type epitaxial layer 200 between the oxide layer patterns 320 by a second epitaxial growth. The reserved n+ type epitaxial layer 400a may be disposed between the oxide layer patterns 320 and may also be disposed on the oxide layer patterns 320. Referring to FIG. 7, reserved n+ type epitaxial layer patterns 400b may be formed between the oxide layer patterns 320 by removing the first reserved n+ type epitaxial layer 400a on the oxide layer patterns 320. In particular, a height of an upper surface of the reserved n+ type epitaxial layer pattern 400b may be about equal to that of an upper surface of the oxide layer pattern 320. Referring to FIG. 8, the plurality of openings 420 that may expose the p+ regions 300 may be formed by the oxide layer patterns 320. Each of the openings 420 may be disposed between the reserved n+ type epitaxial layer patterns 400b.

Figure 9:
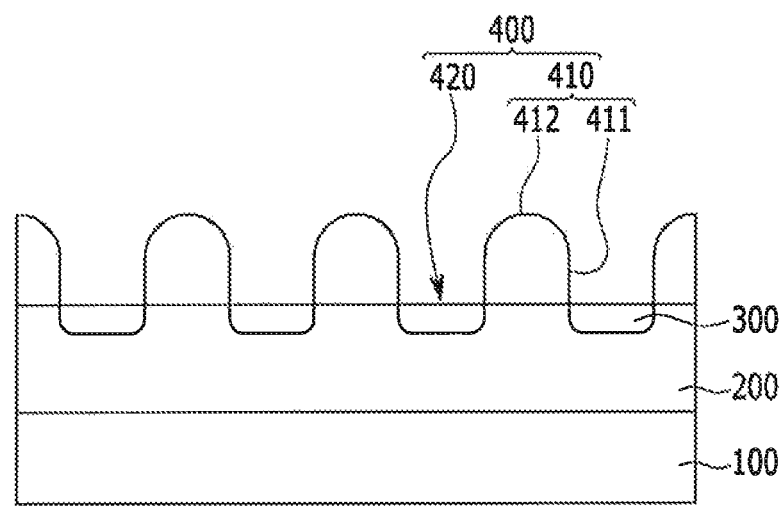

Referring to FIG. 9, upper portions of the reserved n+ type epitaxial layer patterns 400b may be etched by an etch back process to form the upper portions of the reserved n+ type epitaxial layer patterns 400b that protrude, to form the pillar parts 410 which may include the substantially straight line parts 411 and the substantially curved line parts 412 that extend from the substantially straight line parts 411. In particular, the pillar parts 410 and the openings 420 disposed between the pillar parts 410 may form the n+ type epitaxial layer 400. The pillar part 410 of the n+ type epitaxial layer 400 may be disposed on the n− type epitaxial layer 200 and the substantially straight line part 411 of the pillar part 410 of the n+ type epitaxial layer 400 may contact the n− type epitaxial layer 200. Thus, the opening 420 of the n+ type epitaxial layer 400 may be formed without etching the n+ type epitaxial layer 400.

As illustrated in FIG. 1, the Schottky electrode 500 may be formed on the pillar part 410 of the n+ type epitaxial layer 400 and in the opening 420 of the n+ type epitaxial layer 400 and the ohmic electrode 600 may be formed on the second surface of the n+ type silicon carbide substrate 100. The Schottky electrode 500 may include the first Schottky electrode 510 and the second Schottky electrode 520 which may protrude from the first Schottky electrode 510. The first Schottky electrode 510 may contact the substantially curved line part 412 of each pillar part 410 of the n+ type epitaxial layer 400. The second Schottky electrodes 520 may be disposed in the openings 420 of the n+ type epitaxial layer 400, the lower ends of the second Schottky electrodes 520 may contact the p+ regions 300, and the sides of the second Schottky electrodes 520 may contact the substantially straight line part 411 of each pillar part 410 of the n+ type epitaxial layer 400.

While this invention has been described in connection with what is presently considered to be exemplary embodiments, it is to be understood that the invention is not limited to the disclosed embodiments, but, on the contrary, is intended to cover various modifications and equivalent arrangements included within the spirit and scope of the accompanying claims.

| Description of symbols | |
|---|---|
| 100: n+ type silicon carbide substrate | 200: n− type epitaxial layer |
| 300: p+ region | 310: Oxide layer |
| 400: n+ type epitaxial layer | 410: Pillar part |
| 411: Straight line part | 412: Curved line part |
| 420: Opening | 500: Schottky electrode |
| 510: First Schottky electrode | 520: Second Schottky electrode |
| 600: Ohmic electrode | |

What is claimed is:

1. A Schottky barrier diode, comprising:
an n− type epitaxial layer disposed on a first surface of an n+ type silicon carbide substrate;
a plurality of p+ regions disposed within the n− type epitaxial layer;
an n+ type epitaxial layer disposed on the n− type epitaxial layer;
a Schottky electrode disposed on the n+ type epitaxial layer, and
an ohmic electrode disposed on a second surface of the n+ type silicon carbide substrate,
wherein the n+ type epitaxial layer includes a plurality of pillar parts disposed on the n− type epitaxial layer and a plurality of openings disposed between the pillar parts,
wherein the plurality of openings expose the p+ regions, and
wherein each of the pillar parts includes substantially straight line parts that contact the n− type epitaxial layer and substantially curved line parts that extend from the substantially straight line parts.

2. The Schottky barrier diode of claim 1, wherein the Schottky electrode includes a first Schottky electrode disposed on each pillar part and contacting the substantially curved line part of each pillar part and a second Schottky electrode that protrudes from the first Schottky electrode.

3. The Schottky barrier diode of claim 2, wherein the second Schottky electrode is disposed in each opening and a lower end of the second Schottky electrode contacts the p+ regions.

4. The Schottky barrier diode of claim 3, wherein one side of the second Schottky electrode contacts the substantially straight line part of each pillar part.

5. A method of manufacturing a Schottky barrier diode, comprising:
forming an n− type epitaxial layer on a first surface of an n+ type silicon carbide substrate;
forming a plurality of p+ regions by implanting a p+ ion into a portion of a surface of the n− type epitaxial layer;
forming an oxide layer on the n− type epitaxial layer and the p+ regions;
forming a first oxide layer pattern, by etching the oxide layer, wherein the first oxide layer pattern exposes a portion of the n− type epitaxial layer;
forming a reserved n+ type epitaxial layer between the oxide layer patterns and on the oxide layer patterns;
forming a reserved n+ type epitaxial layer pattern between the oxide layer patterns by removing the reserved n+ type epitaxial layer disposed on the oxide layer pattern;
forming a n+ type epitaxial layer by removing the oxide layer pattern and etching an upper portion of the reserved n+ type epitaxial layer pattern;
forming a Schottky electrode on the n+ type epitaxial layer; and
forming an ohmic electrode on a second surface of the n+ type silicon carbide substrate,
wherein the n+ type epitaxial layer includes a plurality of pillar parts disposed on the n− type epitaxial layer and a plurality of openings disposed between the pillar parts and that expose the p+ regions, and
wherein each of the pillar parts includes substantially straight line parts that contact the n− type epitaxial layer and substantially curved line parts that extend from the substantially straight line parts.

6. The method of claim 5, wherein the openings are formed by removing the oxide layer pattern and the pillar parts are formed by etching the upper portion of the reserved n+ type epitaxial layer pattern.

7. The method of claim 6, wherein the forming of the Schottky electrode includes forming a Schottky electrode on each pillar part and in each opening.

8. The method of claim 7, wherein the Schottky electrode includes a first Schottky electrode disposed on each pillar part and that contacts the substantially curved line part and a second Schottky electrode that protrudes from the first Schottky electrode.

9. The method of claim 8, wherein the second Schottky electrode is disposed in each opening and a lower end of the second Schottky electrode contacts the p+ regions.

10. The method of claim 9, wherein one side of the second Schottky electrode contacts the substantially straight line part of each pillar part.

11. The method of claim 10, wherein a height of an upper surface of the oxide layer pattern is about equal to a height of an upper surface of the reserved n+ type epitaxial layer pattern.

* * * * *